United States Patent
Ikeo et al.

(10) Patent No.: US 9,779,976 B2
(45) Date of Patent: Oct. 3, 2017

(54) ADHESIVE SHEET, METHOD FOR MANUFACTURING SEMICONDUCTOR DEVICE USING SAME, METHOD FOR MANUFACTURING THERMAL AIRFLOW SENSOR USING SAME, AND THERMAL AIRFLOW SENSOR

(71) Applicant: Hitachi Automotive Systems, Ltd., Hitachinaka-shi, Ibaraki (JP)

(72) Inventors: Satoshi Ikeo, Hitachinaka (JP); Toshifumi Sagawa, Hitachinaka (JP); Ryosuke Doi, Hitachinaka (JP); Hiroshi Kikuchi, Hitachinaka (JP); Hideki Mukuno, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/896,084

(22) PCT Filed: Apr. 18, 2014

(86) PCT No.: PCT/JP2014/061002
§ 371 (c)(1),
(2) Date: Dec. 4, 2015

(87) PCT Pub. No.: WO2014/199726
PCT Pub. Date: Dec. 18, 2014

(65) Prior Publication Data
US 2016/0126127 A1  May 5, 2016

(30) Foreign Application Priority Data

Jun. 13, 2013 (JP) ................................ 2013-124292

(51) Int. Cl.
*H01L 21/00* (2006.01)
*H01L 21/683* (2006.01)
(Continued)

(52) U.S. Cl.
CPC ............ *H01L 21/6836* (2013.01); *C09J 7/00* (2013.01); *C09J 7/02* (2013.01); *C09J 201/00* (2013.01);
(Continued)

(58) Field of Classification Search
CPC ...................................................... H01L 21/52
(Continued)

(56) References Cited

U.S. PATENT DOCUMENTS 6,150,681 A * 11/2000 Allen .................. G01L 19/0038
257/254
6,988,399 B1   1/2006 Watanabe et al.
(Continued)

FOREIGN PATENT DOCUMENTS

JP    6-77316 A    3/1994
JP   11-64059 A    3/1999
(Continued)

OTHER PUBLICATIONS

International Search Report (PCT/ISA/210) issued in PCT Application No. PCT/JP2014/061002 dated Jul. 15, 2014 with English translation (eight pages).
(Continued)

*Primary Examiner* — Chandra Chaudhari
(74) *Attorney, Agent, or Firm* — Crowell & Moring LLP

(57) ABSTRACT

Provided is a thermal type airflow volume meter improving measurement accuracy, a method for manufacturing the same, and an adhesive sheet for use therein, the adhesive sheet divided into at least two or more per adherend and having a thickness of approximately 0.1 mm or less is divided to correspond to a shape of the adherend and generates or increases adhesion or stickiness by external energy.

7 Claims, 10 Drawing Sheets

(51) Int. Cl.
| | |
|---|---|
| *C09J 7/00* | (2006.01) |
| *C09J 201/00* | (2006.01) |
| *G01F 1/692* | (2006.01) |
| *G01F 1/684* | (2006.01) |
| *H01L 21/78* | (2006.01) |
| *C09J 7/02* | (2006.01) |
| *G01F 5/00* | (2006.01) |
| *H01L 23/31* | (2006.01) |
| *H01L 21/56* | (2006.01) |
| *G01F 15/10* | (2006.01) |

(52) U.S. Cl.
CPC ............ *G01F 1/6845* (2013.01); *G01F 1/692* (2013.01); *G01F 5/00* (2013.01); *H01L 21/565* (2013.01); *G01F 1/692*; *G01F 5/00* (2013.01); *H01L 21/565* (2013.01); *H01L 21/78* (2013.01); *H01L 23/3107* (2013.01); *C09J 2203/326* (2013.01); *G01F 15/10* (2013.01); *H01L 2221/68327* (2013.01); *H01L 2221/68377* (2013.01); *H01L 2224/05554* (2013.01); *H01L 2224/27436* (2013.01); *H01L 2224/298* (2013.01); *H01L 2224/45144* (2013.01); *H01L 2224/48091* (2013.01); *H01L 2224/73265* (2013.01); *H01L 2224/83191* (2013.01); *H01L 2224/83855* (2013.01); *H01L 2924/10155* (2013.01); *H01L 2924/10158* (2013.01); *H01L 2924/1815* (2013.01)

(58) Field of Classification Search
USPC .......................................................... 438/55
See application file for complete search history.

(56) References Cited

U.S. PATENT DOCUMENTS

| | | | | |
|---|---|---|---|---|
| 7,211,873 | B2* | 5/2007 | Toyoda ................. | B81B 7/0012 257/417 |
| 8,619,185 | B2* | 12/2013 | Yi ........................ | H04N 5/2253 348/373 |
| 2005/0001219 | A1 | 1/2005 | Minamio et al. | |
| 2007/0026572 | A1 | 2/2007 | Hatakeyama et al. | |
| 2010/0129986 | A1 | 5/2010 | Kamiya et al. | |
| 2012/0055245 | A1 | 3/2012 | Doi et al. | |

FOREIGN PATENT DOCUMENTS

| | | |
|---|---|---|
| JP | 2001-85360 A | 3/2001 |
| JP | 2004-266163 A | 9/2004 |
| JP | 2007-281415 A | 10/2007 |
| JP | 2009-36639 A | 2/2009 |
| JP | 2009-36641 A | 2/2009 |
| JP | 2011-77436 A | 4/2011 |
| JP | 2013-103959 A | 5/2013 |

OTHER PUBLICATIONS

European Search Report issued in counterpart European Application No. 14810749.3 dated Jan. 23, 2017 (seven pages).
Japanese Office Action issued in counterpart Japanese Application No. 2015-522625 dated Aug. 2, 2016 with partial English-language translation (seven (7) pages).

* cited by examiner

FIG. 10A
FIG. 10B
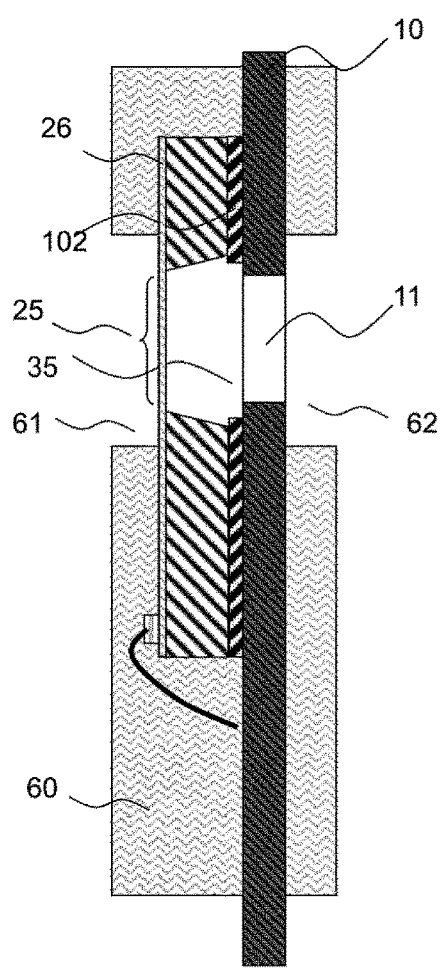
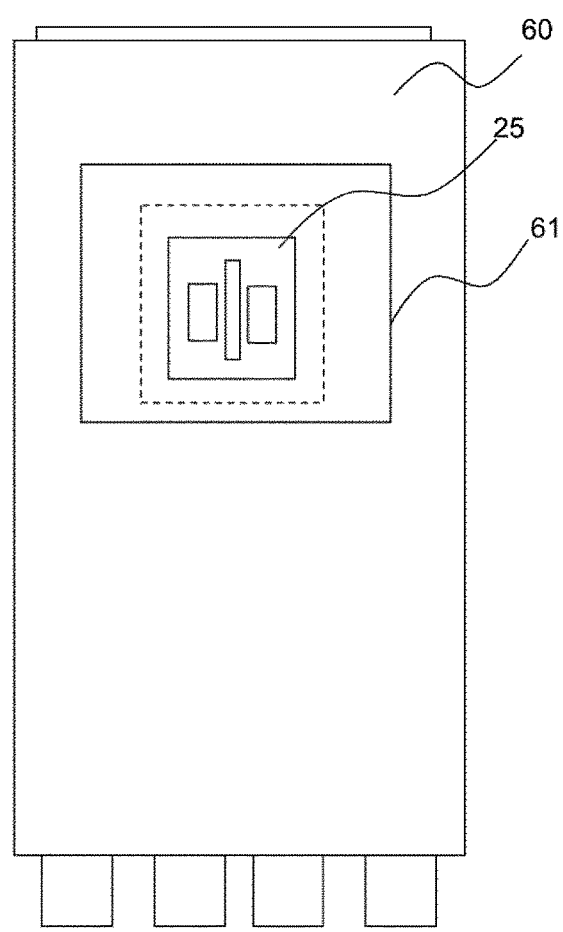

ADHESIVE SHEET, METHOD FOR MANUFACTURING SEMICONDUCTOR DEVICE USING SAME, METHOD FOR MANUFACTURING THERMAL AIRFLOW SENSOR USING SAME, AND THERMAL AIRFLOW SENSOR

TECHNICAL FIELD

The present invention relates to a method for manufacturing a semiconductor device, and more specifically relates to a manufacturing method suitable for a thermal type airflow volume sensor installed in an air intake system of a car engine and appropriate for detecting an intake air volume of the engine, a thermal type airflow volume sensor, and an adhesive sheet for use therein.

BACKGROUND ART

Conventionally, as an airflow volume sensor installed in an intake air passage of an internal combustion engine of a car or the like to measure an intake air volume, a thermal type sensor is becoming mainstream since the thermal type sensor can detect a mass airflow volume directly.

Recently, an airflow volume sensor in which a film of a resistor and an insulating layer is deposited on a silicon substrate by means of a semiconductor micromachining technique, part of the silicon substrate is thereafter removed by a solvent represented by KOH or the like, and a thin film portion (a diaphragm) is formed attracts attention since the airflow volume sensor has quick responsiveness and can detect backflow, taking advantage of the quick responsiveness. Also, in recent years, for the purpose of reducing the number of parts of a substrate portion (a printed substrate, a ceramic substrate, or the like), the airflow volume sensor of a transfer mold package type is being considered, in which the airflow volume sensor is implemented on a lead frame, and in which an outer circumferential portion thereof is molded by a plastic.

In a case in which a semiconductor circuit element such as an LSI and a microcomputer is molded, the circuit element and the lead frame are bonded with use of an adhesive sheet in many cases. In a general method for using the adhesive sheet, the adhesive sheet is stuck to a back surface side in a state of a semiconductor circuit wafer, and by cutting the adhesive sheet layer simultaneously at the time of dicing the wafer in a dicing process, the adhesive sheet is in a state of being stuck to an entire back surface of each semiconductor circuit chip. It is advantageous in that a process of printing a solvent as in a case of using a solvent-type adhesive can be omitted since the diced semiconductor circuit element can be implemented on the lead frame as it is.

CITATION LIST

Patent Literature

PTL 1: Publication of JP 2001-85360 A

SUMMARY OF INVENTION

Technical Problem

Meanwhile, the adhesive sheet is used for various applications. In a case in which the adhesive sheet is used for a semiconductor element, the adhesive sheet is used mainly for an integrated circuit chip provided with no backside process represented by an IC chip. A technique described in PTL 1 does not consider a problem specific to a case in which a physical quantity sensor produced by forming a diaphragm portion in a semiconductor element is bonded. The specific problem will be described below.

In particular, in implementing on a support substrate a thermal type airflow volume sensor in which a thin film portion is formed in a semiconductor element, in a case in which an area of a back surface of the diaphragm portion is in an airtight state, air in the airtight area of the back surface of the diaphragm portion expands and contracts along with a temperature change and a pressure change, which causes a volume change. As a result, the diaphragm portion is deformed, and an error may occur at the time of detection of an airflow volume. To prevent the area of the back surface of the diaphragm portion from being airtight, it can be thought that the support substrate on which the semiconductor element is implemented is provided with a ventilation opening to let air outside, for example. However, since the semiconductor element having the diaphragm portion is bonded to the support substrate provided with the ventilation opening via the adhesive sheet to implement the semiconductor element on the support substrate, this adhesive sheet also needs to be provided with a ventilation opening. PTL 1 describes a method for sticking an adhesive tape to an arbitrary chip by forming a slit in the adhesive tape in advance. However, the method aims to peel the arbitrary chip at the time of processing a thin semiconductor wafer and does not assume sticking the adhesive sheet having the ventilation opening to the semiconductor element provided with the diaphragm portion. For this reason, in PTL 1, an area surrounded by the diaphragm portion formed in the semiconductor element and the adhesive sheet becomes in an airtight state, and an error may occur at the time of detecting the airflow volume.

An object of the present invention is to provide a thermal type airflow volume meter improving measurement accuracy, a method for manufacturing the same, and an adhesive sheet for use therein.

Solution to Problem

To achieve the above object, an adhesive sheet of the present invention is divided into at least two or more per adherend and having a thickness of approximately 0.1 mm or less, the adhesive sheet is divided to correspond to a shape of the adherend, and adhesion or stickiness is generated or increased by external energy.

Advantageous Effects of Invention

According to the present invention, a thermal type airflow volume meter improving measurement accuracy, a method for manufacturing the same, and an adhesive sheet for use therein can be provided.

BRIEF DESCRIPTION OF DRAWINGS

FIGS. 10A and 10B illustrate an embodiment of the thermal type airflow volume sensor according to the present invention.

DESCRIPTION OF EMBODIMENTS

First Embodiment

A thermal type airflow volume sensor using a method for forming a ventilation opening of an adhesive sheet according to an embodiment of the present invention will hereinbelow be described.

A method for forming a ventilation opening of an adhesive sheet will be described with reference to the drawings. FIGS. 1(*a*) to 1(*d*) illustrate a slitting division method of an adhesive sheet.

FIG. 1(*a*) illustrates a state in which a sheet-adhesive-attaching dicing tape 101 before an adhesive sheet 102 is divided is stuck to a dicing ring 100. At this time, at a part serving as a sticking surface between the dicing ring 100 and the sheet-adhesive-attaching dicing tape 101, the dicing ring 100 may be stuck to a side of the adhesive sheet 102 as in FIG. 1(*b*) or to a side of the dicing tape 103 as in FIG. 1(*c*).

FIG. 1(*d*) illustrates a state in which, in the state in FIG. 1(*a*), slitting division has been performed to the adhesive sheet 102 by a dicing machine. As illustrated in FIG. 1(*d*), dicing is performed at pitches of P1 and P3 and thereafter at pitches of P2 and P4 to leave the adhesive sheet 102 on the dicing tape 103, and the adhesive sheet 102 can be divided at regular pitches with dimensions of Dx and Dy, for example. As for a dicing order at this time, the adhesive sheet 102 may be divided in an arbitrary cutting order.

Figure 1A:
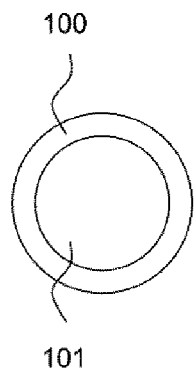
FIGS. 1A-1D schematically illustrate slitting division of an adhesive sheet according to the present invention.
Figure 1B:
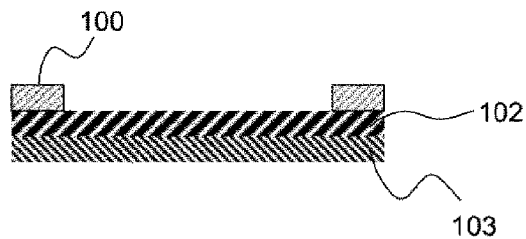
Figure 1C:
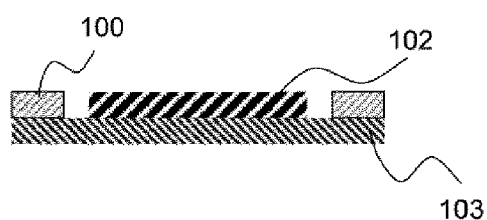
Figure 1D:
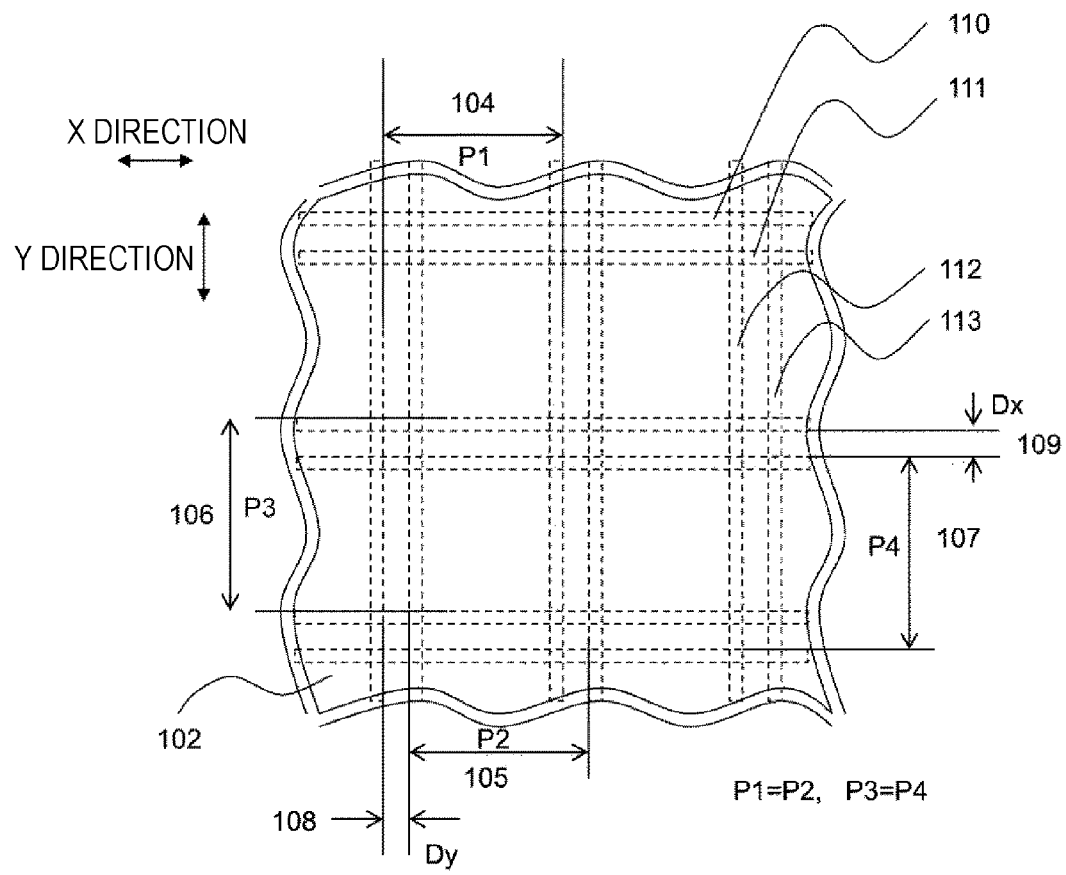
Figure 2A:
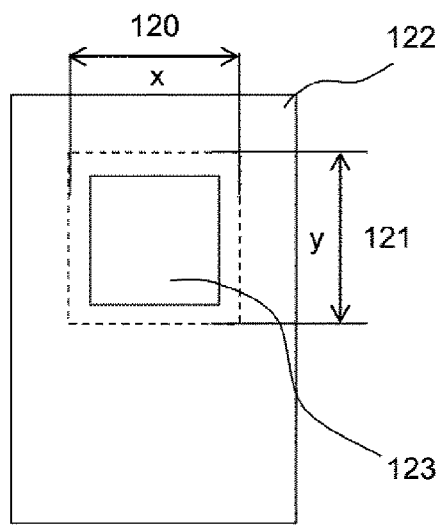
FIGS. 2A and 2B schematically illustrate a semiconductor element provided with a thin film.
Figure 2B:
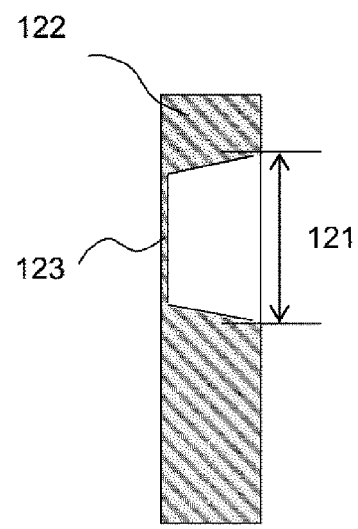

FIGS. 2(*a*) and 2(*b*) illustrate a semiconductor element 122 provided with a thin film according to the first embodiment of the present invention. FIG. 2(*a*) is a plan view of the semiconductor element 122, and FIG. 2(*b*) is a cross-sectional view of the semiconductor element 122. As illustrated in FIGS. 2 (*a*) and 2(*b*), in a flow volume detection element, a laminated structure film of an insulating film layer is formed on the semiconductor substrate 122 such as silicon, and a diaphragm 123 is formed by partially removing a back surface side of the semiconductor substrate 122 with use of potassium hydroxide or the like.

Figure 3B:
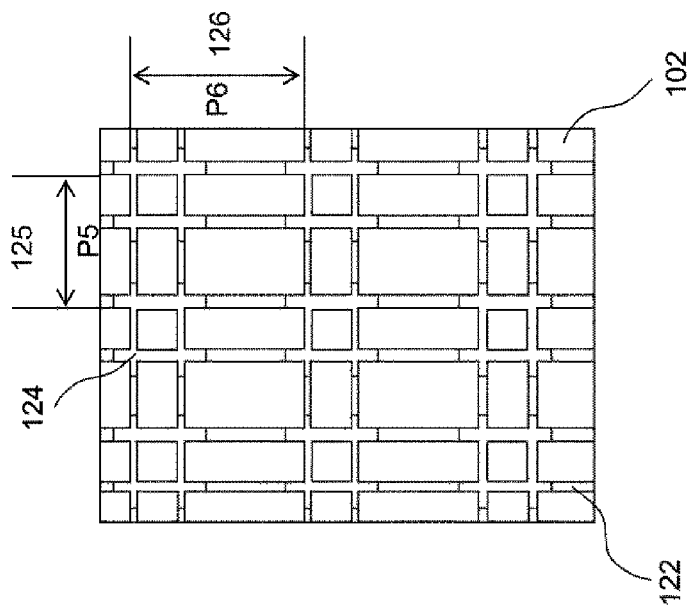
FIGS. 3A and 3B schematically illustrate sticking of the adhesive sheet.
Figure 3A:
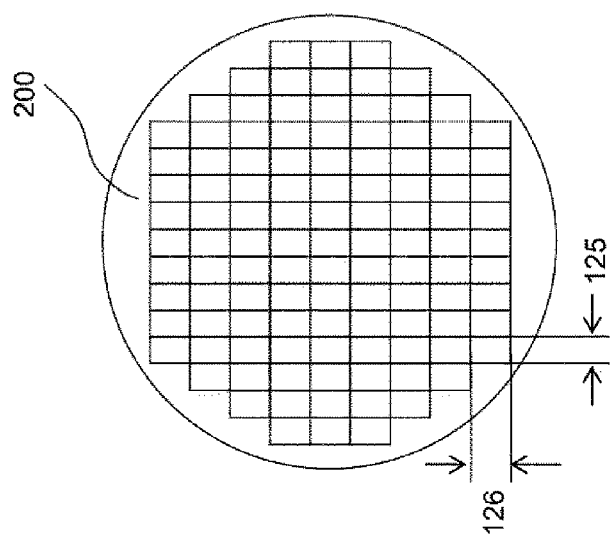

Next, a method for sticking the adhesive sheet 102 to the semiconductor element 122 provided with the thin film 123 will be described with reference to FIGS. 1(*a*) to 3(*b*). The slitting pitches illustrated in FIG. 1(*d*) are made to correspond to chip pitches P5 and P6 of a semiconductor element wafer 200 illustrated in FIG. 3(*a*) to establish P1=P2=P5 and P3=P4=P6. Also, the sheet-adhesive-attaching dicing tape 103 is stuck and bonded to the semiconductor element wafer 200 so that each area surrounded by the leaving dimensions Dx and Dy in FIG. 1(*d*) may fall in an opening area illustrated in FIGS. 2(*a*) and 2 (*b*). At this time, the dimensions Dx and Dy illustrated in FIG. 1(*d*) satisfy Dx<opening dimension x and Dy<opening dimension y.

Figure 5:
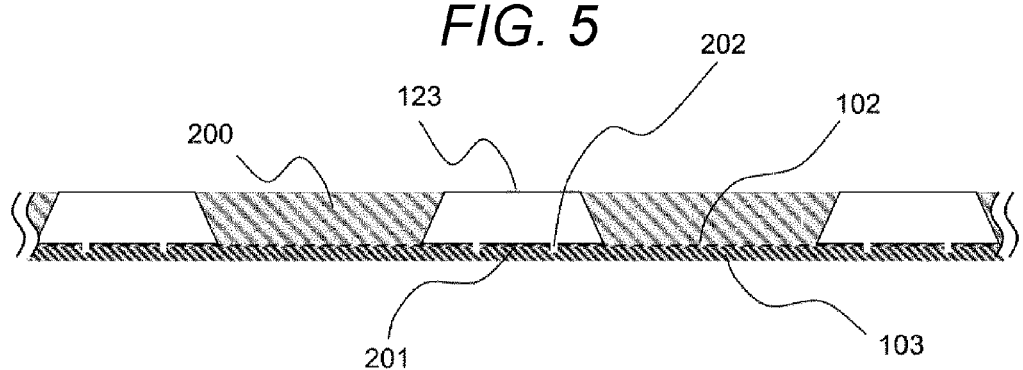
FIG. 5 schematically illustrates sticking of the adhesive sheet.

As a result, as illustrated in FIG. 5, a divided adhesive sheet (s) 201 is not bonded directly below the diaphragm 123 since the divided adhesive sheet (s) 201 does not contact the semiconductor element wafer there. In other words, slits produced by dicing are formed in an area in a cavity on a back surface side of the diaphragm 123.

Figure 4:
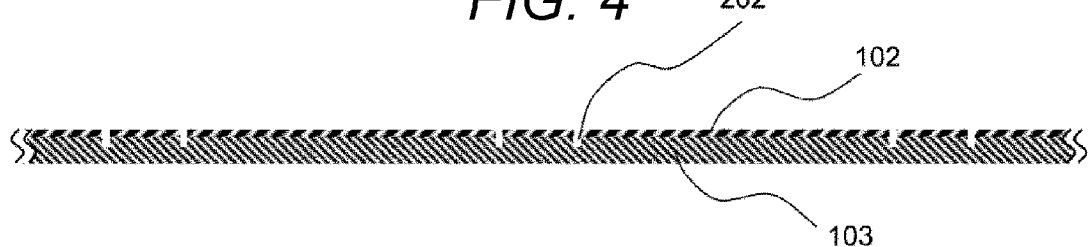
FIG. 4 schematically illustrates the slitting division of the adhesive sheet according to the present invention.

FIG. 4 illustrates an overview of the slitting division of the adhesive sheet 102.

The adhesive sheet 102 is a mixture of a glue material softened and generating adhesion by application of heat, an initiator hardening a base material by application of heat, ultraviolet, light, or an electromagnetic wave, and a filler. By heating the adhesive sheet 102 in an attaching state to an adherend and applying pressure and ultrasound to the adhesive sheet 102 at the same time, the adhesive sheet 102 is bonded and hardened while the number of contact points with the adherend is increased. As for the glue material, by performing a dicing process in a state in which the glue material has no adhesion, digging resistance at the time of the process is reduced, and attachment of foreign matters is prevented. In a case in which heating of the adherend is restricted, the initiator is selected to harden the base material with the ultraviolet, the light, or the electromagnetic wave. The filler improves functions of the adhesive sheet 102. For example, mixing silica particles enables strength of the adhesive sheet 102 after hardening to be increased, and mixing metal particles enables the adhesive sheet 102 to be conductive.

In sticking the adhesive sheet 102, in a case in which bubbles are confined between the semiconductor element 122 and the adhesive sheet 102 incorporated in a semiconductor device, for example, the semiconductor element 122 may be inclined by the bubbles thereby lowering the performance. Also, since the bubbles expand and contract due to a temperature change, the bubbles may cause fatigue of a connection part and lower durability of the semiconductor device.

Figure 8:
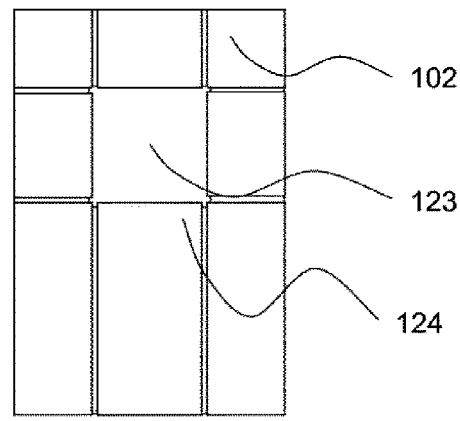
FIG. 8 illustrates an embodiment of forming a ventilation hole in the adhesive sheet according to the present invention.

In the present invention, since the slits produced by dicing are formed in the area in the cavity on the back surface side of the diaphragm 123, and the slits produced by dicing in the adhesive sheet 102 act as ventilation paths as illustrated in FIG. 8, the bubbles are hard to be caught in the bonding surface at the time of bonding, and gas generated from the adhesive sheet at the time of bonding is easy to be let out.

Figure 6:
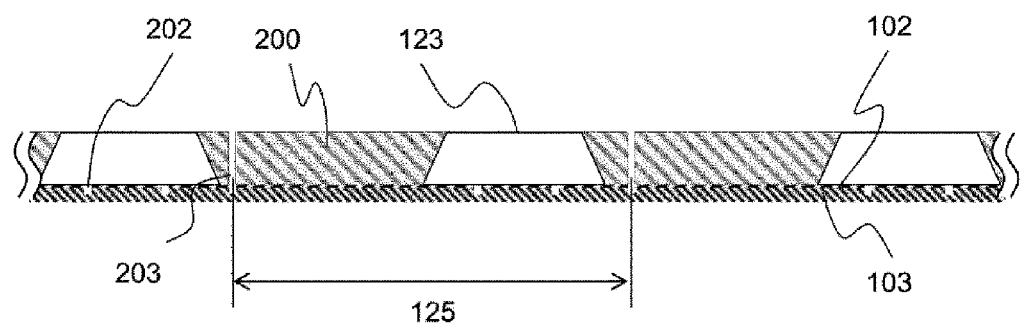
FIG. 6 schematically illustrates dicing.

Subsequently, as illustrated in FIG. 6, the semiconductor element wafer 200 is diced by dicing. The adhesive sheet 102 has higher digging resistance at the time of the dicing process than silicon and easily causes clogging of a dicing blade. Thus, the thickness of the adhesive sheet 102 is set to approximately 0.1 mm or less to prevent cracks on the back surface of the semiconductor element wafer 200 and burrs of the adhesive sheet 102 from being generated at the time of dicing.

Figure 7:
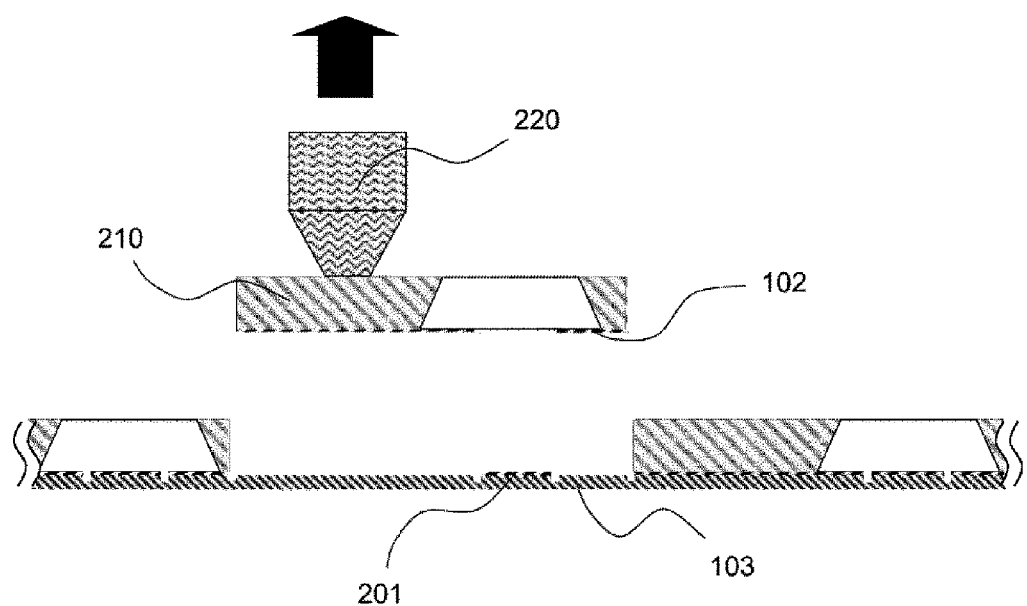
FIG. 7 schematically illustrates pickup.

Subsequently, when the diced semiconductor element 122 is picked up, the divided adhesive sheet (s) 201 is left on the dicing tape as illustrated in FIG. 7. Accordingly, on the back surface of the picked semiconductor element 122, the divided adhesive sheets 102 are attached, and at a part of the semiconductor element 122 directly below the thin film portion, no adhesive sheet 102 exists, and a ventilation opening is formed, as illustrated in FIG. 8.

Accordingly, for the process, an expensive system such as a laser processing machine is not required, and a dicing system for use in dicing into chips can be shared. Thus, a dedicated system can be dispensed with.

Also, as a general method, forming a ventilation opening by processing a through hole into the dicing tape 103 with use of a puncher processing machine is considered. However, when the semiconductor wafer 200 provided with the thin film 123 is provided with the dicing tape 103 having the through hole and is diced, there is a fear that the thin film 123 may be damaged. Also, there is a fear of deformation around the hole and generation of process debris. Another conceivable method is processing a hole by means of laser. However, there is a fear of difficulty in coping with thickness variation of the adhesive sheet, thermal deformation and adhesion lowering around the hole, and generation of burn debris.

Conversely, in the present method, the ventilation opening can be formed without opening a through hole in the dicing tape 103 at the time of forming the ventilation opening, and since the ventilation opening is formed with process accuracy of dicing, the ventilation opening can be provided to the semiconductor element 122 in the semiconductor wafer 200 at accurate pitches. Also, an influence of the thickness variation of the adhesive sheet 102 on the process accuracy is slight, and deformation and protrusion around the opening resulting from thickness fluctuation do not occur. In addition, cutting debris generated by the process can be removed easily by washing.

Figure 9A:
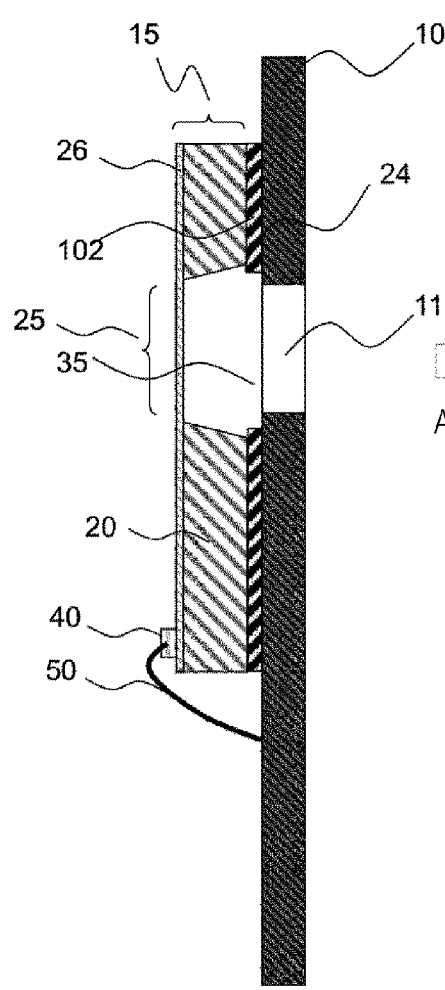
FIGS. 9A and 9B illustrate an embodiment of a thermal type airflow volume sensor according to the present invention.
Figure 9B:
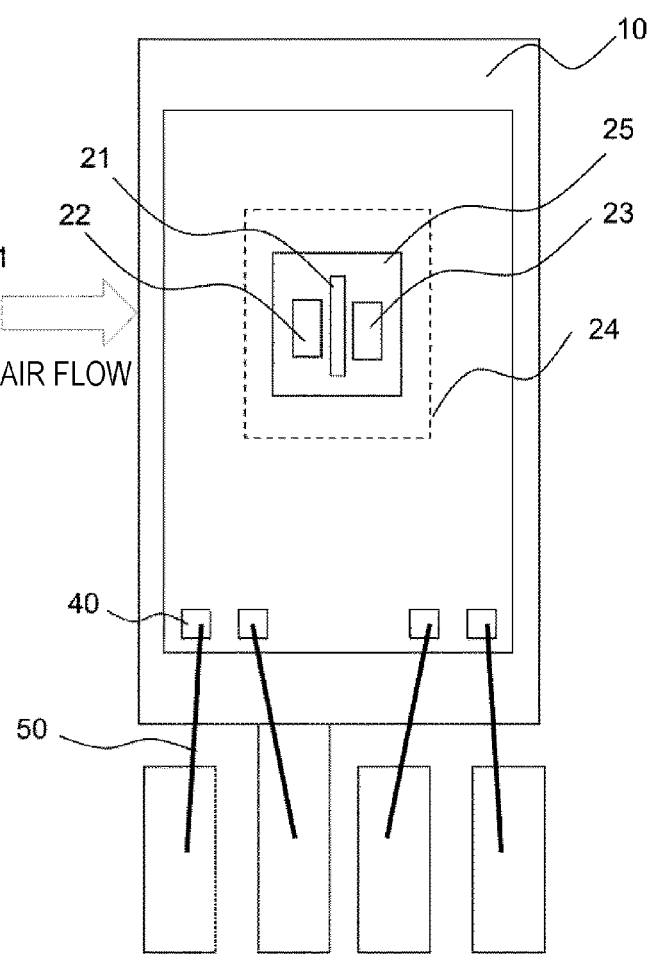

Next, a thermal type airflow volume sensor using the method for forming a ventilation opening of the adhesive sheet 102 according to the present invention will be described with reference to FIGS. 9(a) to 11. FIGS. 9(a) and 9(b) illustrate a semiconductor element implementation structure according to an embodiment of the thermal type flow volume sensor. FIG. 9(a) is a cross-sectional view as seen from a side, and FIG. 9(b) is a surface view as seen from a top.

As illustrated in FIGS. 9(a) and 9(b), in a flow volume detection element 15, a laminated structure film 26 of an insulating film layer and a resistor layer is formed on a semiconductor substrate 20 such as silicon, and a diaphragm 25 is formed by partially removing a back surface side of the semiconductor substrate 20 with use of potassium hydroxide (KOH) or the like. On the diaphragm 25, a heat generation resistor 21, an upstream-side temperature measurement resistor 22, and a downstream-side temperature measurement resistor 23 are formed. Also, an electrode pad 40 is formed on a surface of the semiconductor substrate 20 and is electrically connected to an outside of the semiconductor substrate 20 via a wire bonding 50 such as a gold wire. This flow volume detection element 15 is fixed on a lead frame 10 with the adhesive sheet 102.

The lead frame 10 is provided with a ventilation hole 11 for the purpose of ventilation of aback surface of the diaphragm. Further, a part of an area in which a diaphragm back surface opening end portion 24 and the ventilation hole 11 formed in the lead frame 10 correspond (that is, in FIGS. 9(a) and 9(b), the part is equivalent to an area of the reference sign 11) is provided with a ventilation hole 35 formed in the adhesive sheet 102.

Accordingly, in the structure illustrated in FIGS. 9(a) and 9 (b), the back surface of the diaphragm can communicate with external air via the two ventilation holes (11 and 35).

Next, a mold structure in which the structure in FIGS. 9 (a) and 9 (b) is sealed by a plastic by means of transfer mold will be described with reference to FIGS. 10(a) and 10(b).

An outer circumferential portion of the structure in FIGS. 9(a) and 9(b) is sealed by a mold plastic 60, and an opening 61 is formed on a side of a front surface of the diaphragm 25 for the purpose of partially exposing the diaphragm 25 from the mold plastic 60. Also, an opening 62 is formed on a side of a back surface of the ventilation hole 11 formed in the lead frame 10 for the purpose of ventilation. By doing so, even in a case in which the flow volume detection element 15 and the lead frame 10 are sealed by the mold plastic 60, the back surface of the diaphragm 25 communicates with external air and can prevent an airtight state.

Figure 11:
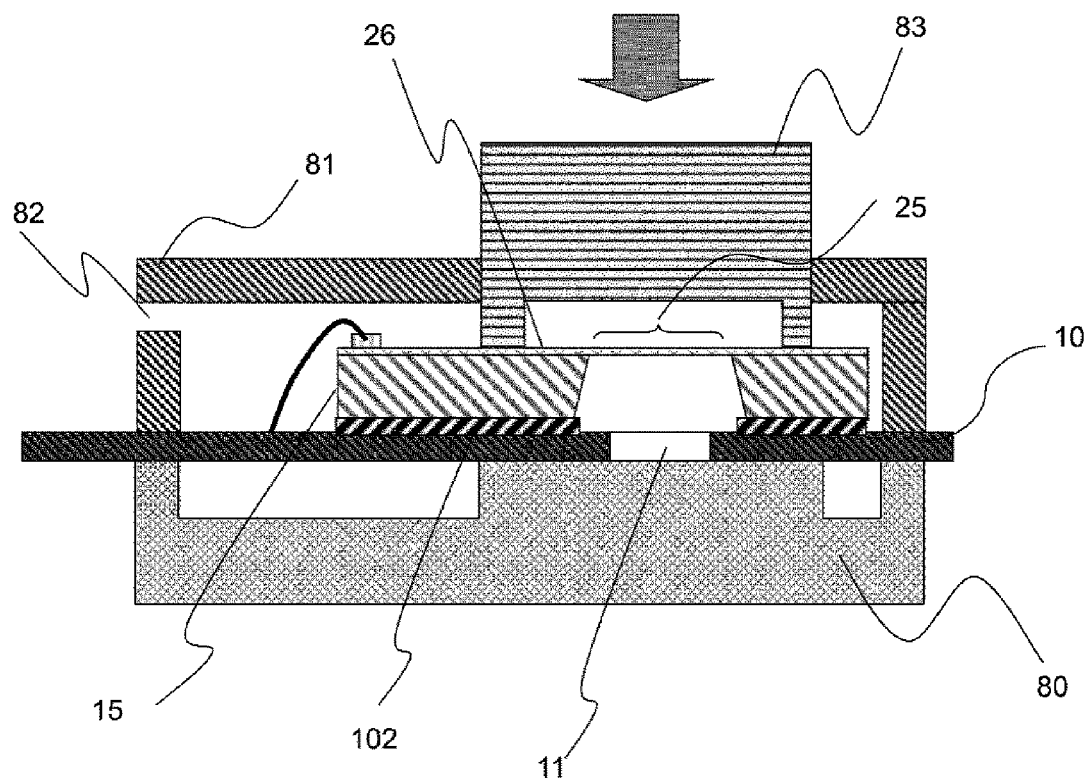
FIG. 11 schematically illustrates molding.

Next, a method for manufacturing the mold structure described with reference to FIGS. 10(a) and 10(b) (hereinbelow referred to as "the transfer mold package") will be described with reference to FIG. 11. When the transfer mold package in which the flow volume detection element 15 is molded by the mold plastic 60 detects a flow volume, the diaphragm 25 detecting the airflow volume must partially be exposed from the mold plastic 60 to a medium to be measured. As a method for achieving this, the lead frame 10 implementing the flow volume detection element 15 is interposed between a lower mold 80 and an upper mold 81. At this time, an inlet 82 for pouring the mold plastic is provided in either the lower mold 80 or the upper mold 81. Also, to partially expose the diaphragm 25, a structure in which an insert die 83, which is a separate mold from the upper mold 81, is inserted in the upper mold 81, is employed, and this insert die 83 receives load from an upper portion to be brought into close contact with a surface of the flow volume detection element 15. Also, the lower mold 80 is provided with a projection portion to prevent the mold plastic 60 from flowing into the ventilation hole 11 formed in the lead frame 10, and this projection portion and the lead frame 10 are brought into close contact with each other at an area containing the ventilation hole 11. When the plastic is poured from the inlet 82 in this state, the mold structure semiconductor package illustrated in FIGS. 10(a) and 10(b) can be manufactured.

Second Embodiment

A second embodiment of the thermal type airflow volume sensor using the method for forming a ventilation opening of the adhesive sheet 102 according to the present invention described in the first embodiment will hereinbelow be described.

Figure 12A:
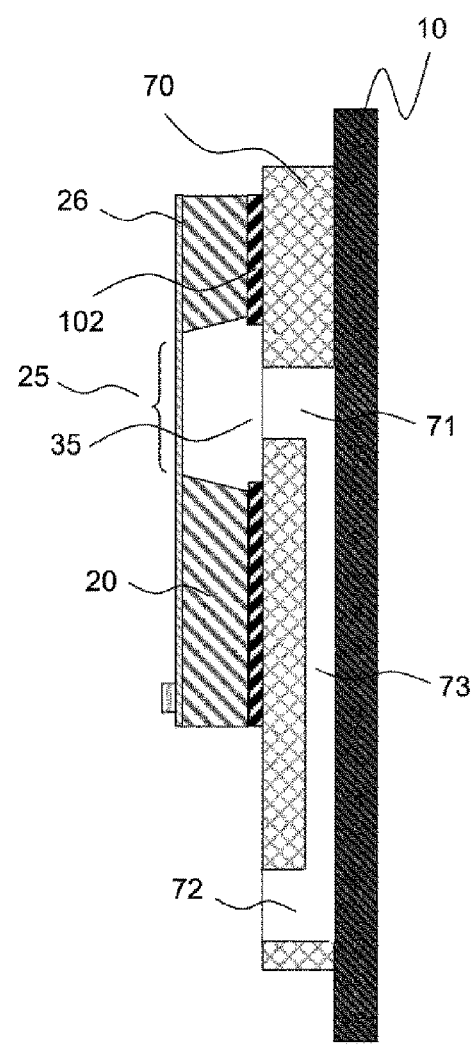
FIGS. 12A and 12B illustrate an embodiment of the thermal type airflow volume sensor according to the present invention.
Figure 12B:
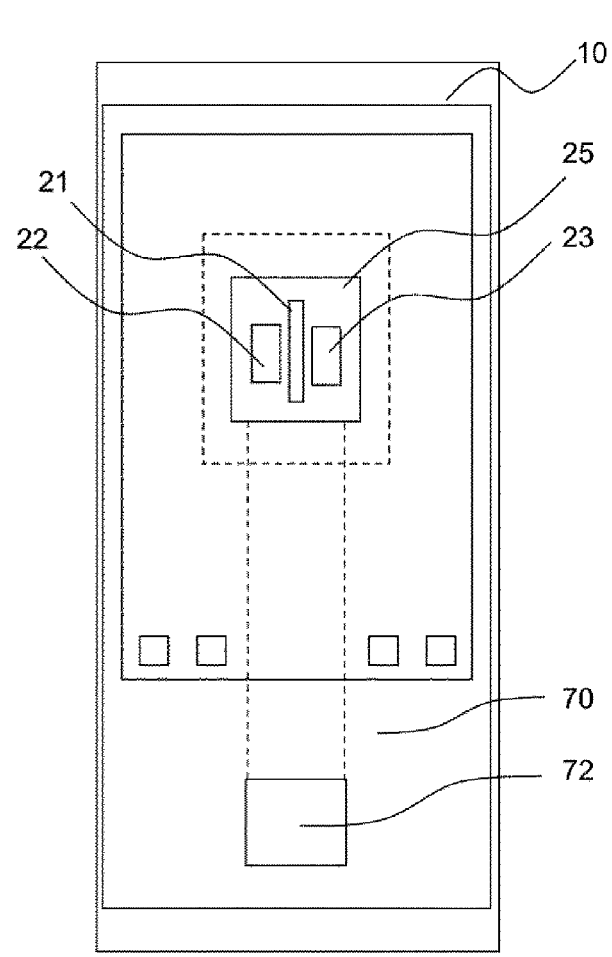

FIGS. 12(a) and 12(b) illustrate a semiconductor element implementation structure before the thermal type flow volume sensor is molded. FIG. 12 (a) is a cross-sectional view as seen from a side, and FIG. 12(b) is a surface view as seen from a top.

As illustrated in FIGS. 12(a) and 12(b), what is different from the first embodiment is a support substrate 70, which is a separate part, intervening between the semiconductor substrate 20 and the lead frame 10. Also, in the second embodiment, the lead frame 10 is provided with no ventilation hole.

As an advantage of such a structure, this structure is effective in a case in which the semiconductor substrate 20 is attached to another support member on an entire surface thereof, and in which the opening 62 formed on the side of the back surface of the ventilation hole 11 formed in the lead frame 10 for the purpose of ventilation illustrated in FIGS. 10(a) and 10(b) is closed in an airtight state. As illustrated in FIGS. 12(a) and 12(b), the support substrate 70, which is the separate part, intervenes, a ventilation hole 71 is formed in the cavity area formed on the side of the back surface of the diaphragm 25, another ventilation hole 72 for circulating air to the side of the semiconductor substrate 20 is formed, the respective ventilation holes 71 and 72 communicate with each other via a groove 73, and air can thus be circulated to the side of the semiconductor substrate 20.

It is to be noted that, although a structure in which the groove 73 is formed in the support substrate 70 serving as the separate part is employed in the description with reference to FIGS. 12(a) and 12(b), a similar effect can be obtained in a case of forming the groove 73 in the lead frame 10.

Also in the structure illustrated in FIGS. 12 (a) and 12 (b), since the ventilation hole 35 is formed in the adhesive sheet 102 in which the area of the diaphragm 25 and the area of the ventilation hole 71 formed in the support substrate 70 correspond, the area of the diaphragm 25 and the ventilation hole 72 for circulating air to the side of the semiconductor substrate can communicate with each other entirely.

Figure 13A:
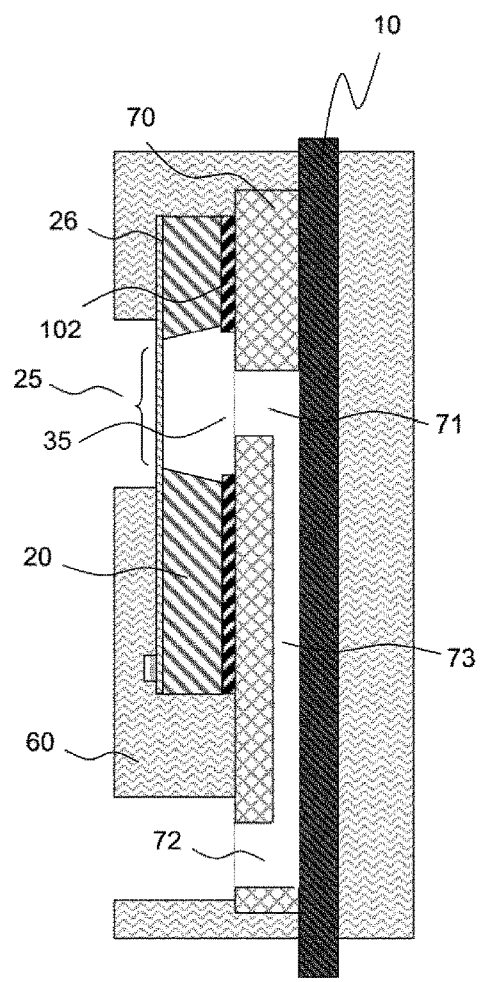
FIGS. 13A and 13B schematically illustrate molding.
Figure 13B:
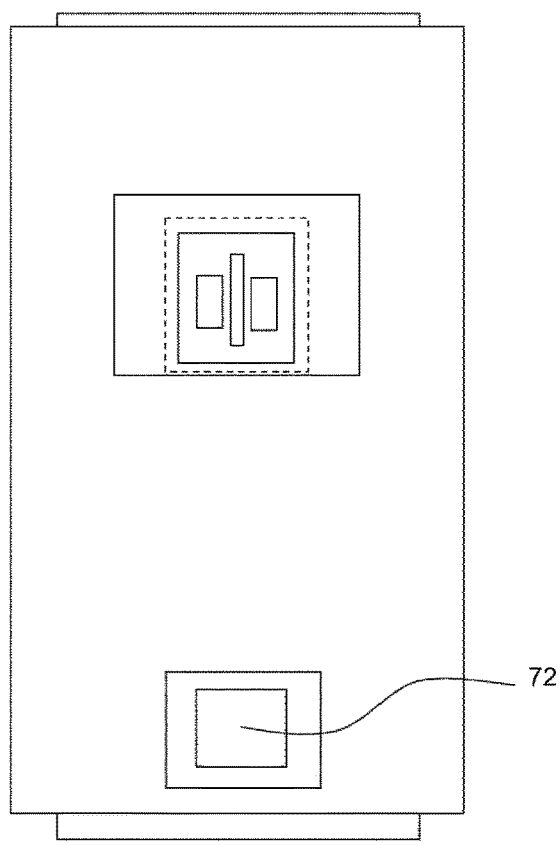

Also, a mold structure in which the structure in FIGS. 12 (a) and 12 (b) is sealed by a plastic by means of transfer mold will be described with reference to FIGS. 13 (a) and 13 (b). The mold structure is different from that in FIGS. 10 (a) and 10 (b) in that the ventilation hole 72 formed in the support substrate 70 is not covered with the transfer mold plastic, either. This enables communication with external air via the ventilation hole 72.

Figure 14:
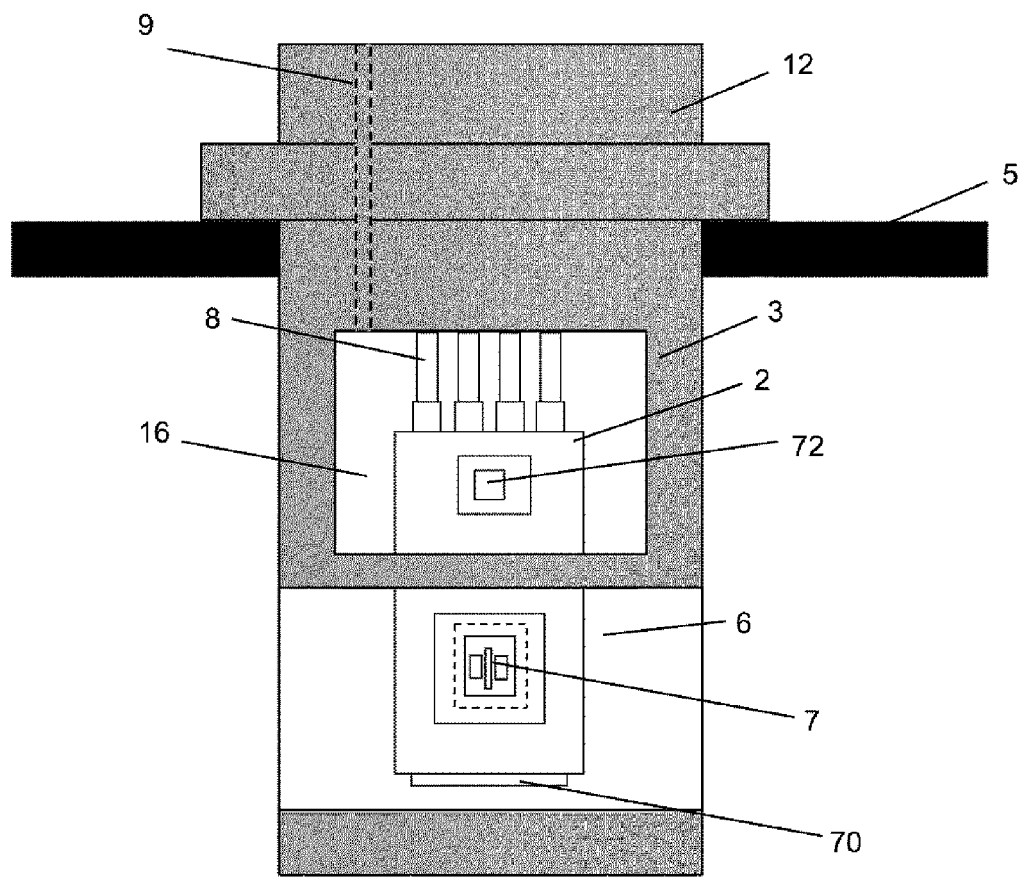
FIG. 14 is a cross-sectional view of the thermal type airflow volume sensor according to the present invention attached to an air intake duct.

Also, an effect of providing the ventilation hole 72 in a separate position, not on the back surface of the element, will be described with reference to FIG. 14. FIG. 14 illustrates the thermal type airflow volume sensor implementing the transfer mold package illustrated in FIGS. 13 (a) and 13 (b), attached to an air intake duct 5. As illustrated in FIG. 14, an end of each connector terminal 8 extends to a circuit chamber 16 and is electrically connected to a semiconductor package 2 in the circuit chamber 16, and the other end extends to a fitting portion of a connector portion 12 and is electrically connected to an external terminal.

A housing 3 is provided with a communication hole 9 causing the circuit chamber 16 and the fitting portion of the connector portion 12 to communicate with each other. Due to the communication hole 9, the circuit chamber 16 communicates with an outside of the air intake duct to prevent the circuit chamber 16 from being in an airtight state.

Here, the ventilation hole 72 formed in the support substrate 70 is ventilated to the different space 16 (circuit chamber) from a bypass passage 6 taking intake air. The bypass passage 6 and the circuit chamber 16 are separated to prevent communication. Also, since the circuit chamber 16 communicates with external air via the ventilation hole 9 formed in the housing 3, airtightness of the back surface of the diaphragm can be avoided. Further, since the bypass passage 6 and the circuit chamber 16 are separated, the ventilation hole 72 formed in the support substrate 70 is not clogged by wastes such as oil and carbon flowing in the bypass passage 6, and reliability is thus improved.

REFERENCE SIGNS LIST 10 lead frame (substrate support member)
11 ventilation hole formed in lead frame
15 flow volume detection element
20 semiconductor substrate
21 heat generation resistor
22 upstream-side temperature measurement resistor
23 downstream-side temperature measurement resistor
24 diaphragm back surface opening end portion
25 diaphragm
26 laminated structure film of insulating film layer and resistor layer
27 semiconductor element back surface outer circumferential portion
28 minimum dimension from diaphragm back surface opening end to semiconductor element back surface outer circumferential portion
30 adhesive sheet
35 ventilation hole formed in adhesive sheet
60 mold plastic
61 mold opening formed on side of front surface
62 mold opening formed on side of back surface
70 substrate support member
71 ventilation hole formed in substrate support member
72 ventilation hole formed in substrate support member
73 groove causing ventilation holes (71 and 72) to communicate with each other
102 adhesive sheet
103 dicing tape
122 semiconductor element (semiconductor substrate)
123 thin film (diaphragm)
124 opening area
200 semiconductor element wafer
201 divided adhesive sheet (s)
202 slit E by dicing
203 slit F by dicing
210 diced semiconductor element
220 pickup nozzle

The invention claimed is:

1. A method for manufacturing a semiconductor device at least including a process of dicing a semiconductor element wafer with use of a dicing machine for use in processing the semiconductor element wafer, the semiconductor element wafer having a diaphragm provided by processing a semiconductor substrate and provided with a dicing tape to which an adhesive sheet is stuck, the method comprising:
 a process of dividing the adhesive sheet on the dicing tape to which the adhesive sheet is stuck with use of slitting by the dicing machine before the adhesive sheet is stuck to the semiconductor element wafer;
 a pickup process of picking up a diced semiconductor element; and
 a process of forming a ventilation hole in the adhesive sheet after the pickup process.

2. The method for manufacturing a semiconductor device according to claim 1, wherein the adhesive sheet is provided with the polygonal ventilation hole having at least three sides.

3. The method for manufacturing a semiconductor device according to claim 1, wherein a maximum dimension of the ventilation hole formed in the adhesive sheet is smaller than a diaphragm back surface opening dimension on a back surface of the semiconductor element.

4. The method for manufacturing a semiconductor device according to claim 2, wherein the adhesive sheet is provided with a slit on an extended line of each of the sides of the formed polygonal ventilation hole.

5. A method for manufacturing a thermal type airflow volume sensor at least including a process of dicing a semiconductor element wafer into respective flow volume detection elements with use of a dicing machine for use in processing the semiconductor element wafer, the semiconductor element wafer including the plurality of flow volume detection elements each having a diaphragm provided by processing a semiconductor substrate and each including on the diaphragm a heat generation resistor and temperature measurement resistors respectively provided on an upstream side and a downstream side of airflow with respect to the heat generation resistor and provided with a dicing tape to which an adhesive sheet is stuck, the method comprising:

a process of dividing the adhesive sheet on the dicing tape to which the adhesive sheet is stuck with use of slitting by the dicing machine before the adhesive sheet is stuck to the semiconductor element wafer;

a pickup process of picking up the diced flow volume detection element; and a process of mounting the picked up flow volume detection element on a support member having a communication hole.

6. The method for manufacturing a thermal type airflow volume sensor according to claim 5, wherein the support member includes a lead frame.

7. A thermal type airflow volume sensor produced in the method for manufacturing a thermal type airflow volume sensor according to claim 5, wherein the communication hole of the support member is provided to open one side of a cavity provided on a side of a back surface of the diaphragm, the adhesive sheet has a ventilation hole formed to cause an area of the cavity of the back surface of the diaphragm and an opening area of the communication hole of the support member to communicate with each other, and the area of the cavity of the back surface of the diaphragm is provided with a slit of the adhesive sheet.

\* \* \* \* \*